United States Patent
Bakalski

(10) Patent No.: US 9,876,480 B2
(45) Date of Patent: Jan. 23, 2018

(54) SYSTEM AND METHOD FOR A TUNABLE CAPACITANCE CIRCUIT

(71) Applicant: Infineon Technologies AG, Neubiberg (DE)

(72) Inventor: Winfried Bakalski, Munich (DE)

(73) Assignee: Infineon Technologies AG, Neubiberg (DE)

( * ) Notice: Subject to any disclaimer, the term of this patent is extended or adjusted under 35 U.S.C. 154(b) by 310 days.

(21) Appl. No.: 14/060,341

(22) Filed: Oct. 22, 2013

(65) Prior Publication Data

US 2015/0109072 A1 Apr. 23, 2015

(51) Int. Cl.
| | |
|---|---|
| H03H 7/01 | (2006.01) |
| H03H 11/04 | (2006.01) |
| H03J 7/10 | (2006.01) |
| H03J 3/20 | (2006.01) |
| H03H 1/00 | (2006.01) |

(52) U.S. Cl.
CPC .......... *H03H 7/0153* (2013.01); *H03H 11/04* (2013.01); *H03J 3/20* (2013.01); *H03J 7/10* (2013.01); *H03H 2001/0014* (2013.01); *H03J 2200/10* (2013.01)

(58) Field of Classification Search
CPC ......... H03H 2001/0014; H03H 7/0153; H03H 11/04; H03J 7/10; H03J 3/20; H03J 2200/10
USPC .................................................. 333/172, 174
See application file for complete search history.

(56) References Cited

U.S. PATENT DOCUMENTS

| | | | | |
|---|---|---|---|---|
| 5,449,953 | A * | 9/1995 | Nathanson | ........ H01L 21/76264 |
| | | | | 257/604 |
| 6,509,805 | B2 | 1/2003 | Ochiai | |
| 7,990,210 | B2 | 8/2011 | Iida et al. | |
| 8,022,789 | B2 * | 9/2011 | Rokos | ........................ H03J 3/04 |
| | | | | 333/174 |
| 9,166,564 | B2 | 10/2015 | Koechlin | |
| 2007/0241834 | A1 | 10/2007 | Lee | |
| 2008/0048236 | A1 * | 2/2008 | Kim | .................... H01L 27/0808 |
| | | | | 257/312 |
| 2009/0160263 | A1 * | 6/2009 | Spears | ..................... H01G 7/06 |
| | | | | 307/109 |
| 2010/0001818 | A1 | 1/2010 | Hsieh | |
| 2010/0244113 | A1 * | 9/2010 | Rieh | ........................ H01L 29/93 |
| | | | | 257/312 |
| 2010/0301956 | A1 | 12/2010 | Nakamura | |
| 2011/0298526 | A1 * | 12/2011 | Homol | ...................... H03F 3/72 |
| | | | | 327/437 |

(Continued)

FOREIGN PATENT DOCUMENTS

| | | |
|---|---|---|
| CN | 101056090 | 10/2007 |
| CN | 102148609 A | 8/2011 |

(Continued)

OTHER PUBLICATIONS

Steel, V. et al., "Tunable RF Technology Overview," Microwave Journal, Nov. 14, 2012, 7 pages.

(Continued)

*Primary Examiner* — Rakesh Patel
(74) *Attorney, Agent, or Firm* — Slater Matsil, LLP

(57) ABSTRACT

A tunable capacitance circuit comprises a plurality of varactor transistors which are coupled in series. An antenna tuner comprises such a tunable capacitance circuit.

32 Claims, 8 Drawing Sheets

(56) References Cited

U.S. PATENT DOCUMENTS

| | | | |
|---|---|---|---|
| 2014/0036406 A1* | 2/2014 | Tesson | H01L 23/4824 |
| | | | 361/281 |
| 2014/0062575 A1* | 3/2014 | Hurwitz | H03K 17/161 |
| | | | 327/379 |
| 2014/0266408 A1* | 9/2014 | Guimaraes | H01L 28/40 |
| | | | 327/534 |

FOREIGN PATENT DOCUMENTS

| | | |
|---|---|---|
| DE | 10335357 | 3/2005 |
| JP | 2002043842 A | 2/2002 |
| JP | 2006108550 A | 4/2006 |
| JP | 2010278658 A | 12/2010 |
| KR | 20090051000 A | 5/2009 |
| KR | 20100027847 A | 3/2010 |

OTHER PUBLICATIONS

Huang, C. et al., "A 67 dBm OIP3 Multistacked Junction Varactor," IEEE Microwave and Wireless Components Letters, vol. 18, No. 11, Nov. 2008, pp. 749-751.

Maget, J. et al., "Varactors and Inductors for Integrated RF Circuits in Standard MOS Technologies," University of Bundeswehr Muenchen, Dec. 18, 2002, 92 pages.

* cited by examiner

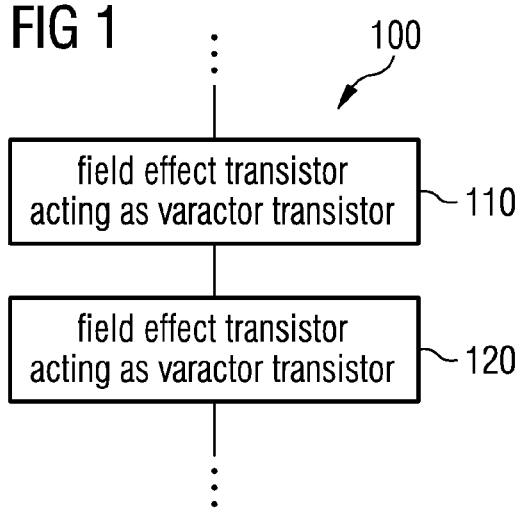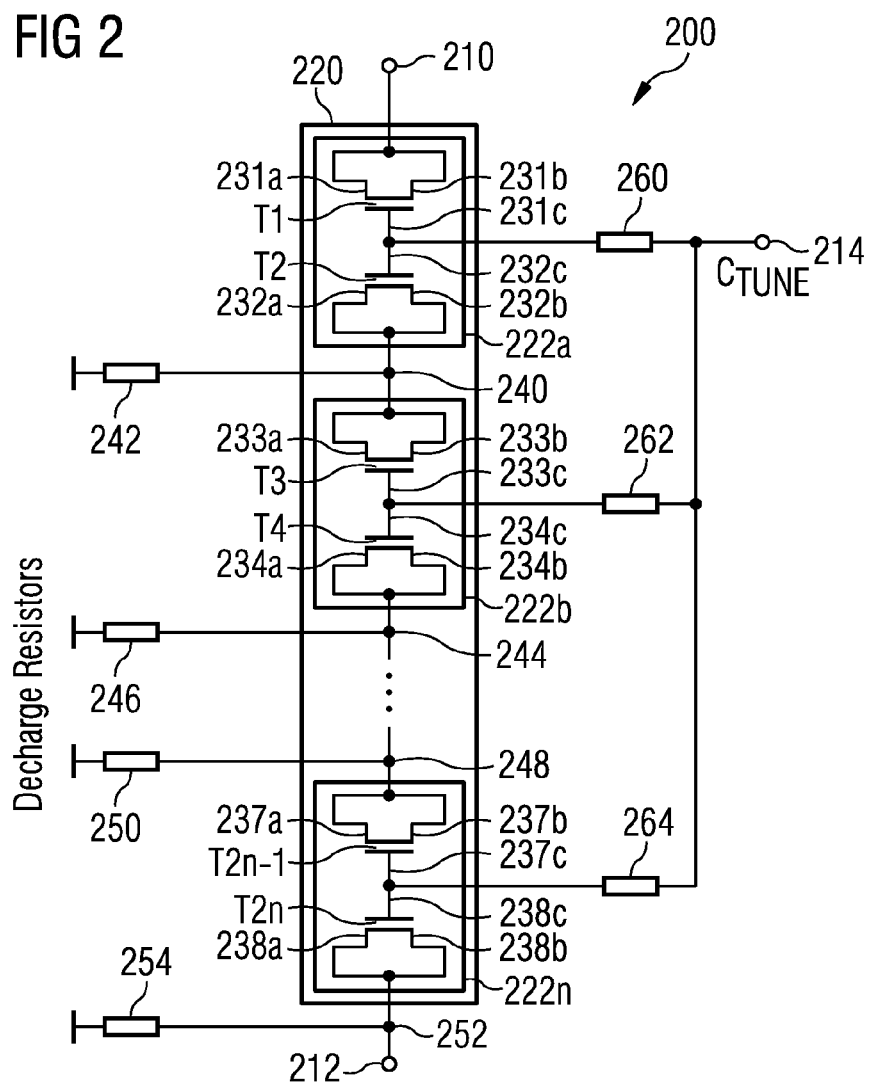

- free positive charge (holes)
- fixed positive charge (donator ion)
- free negative charge (electrons)
- fixed negative charge (acceptor ion)

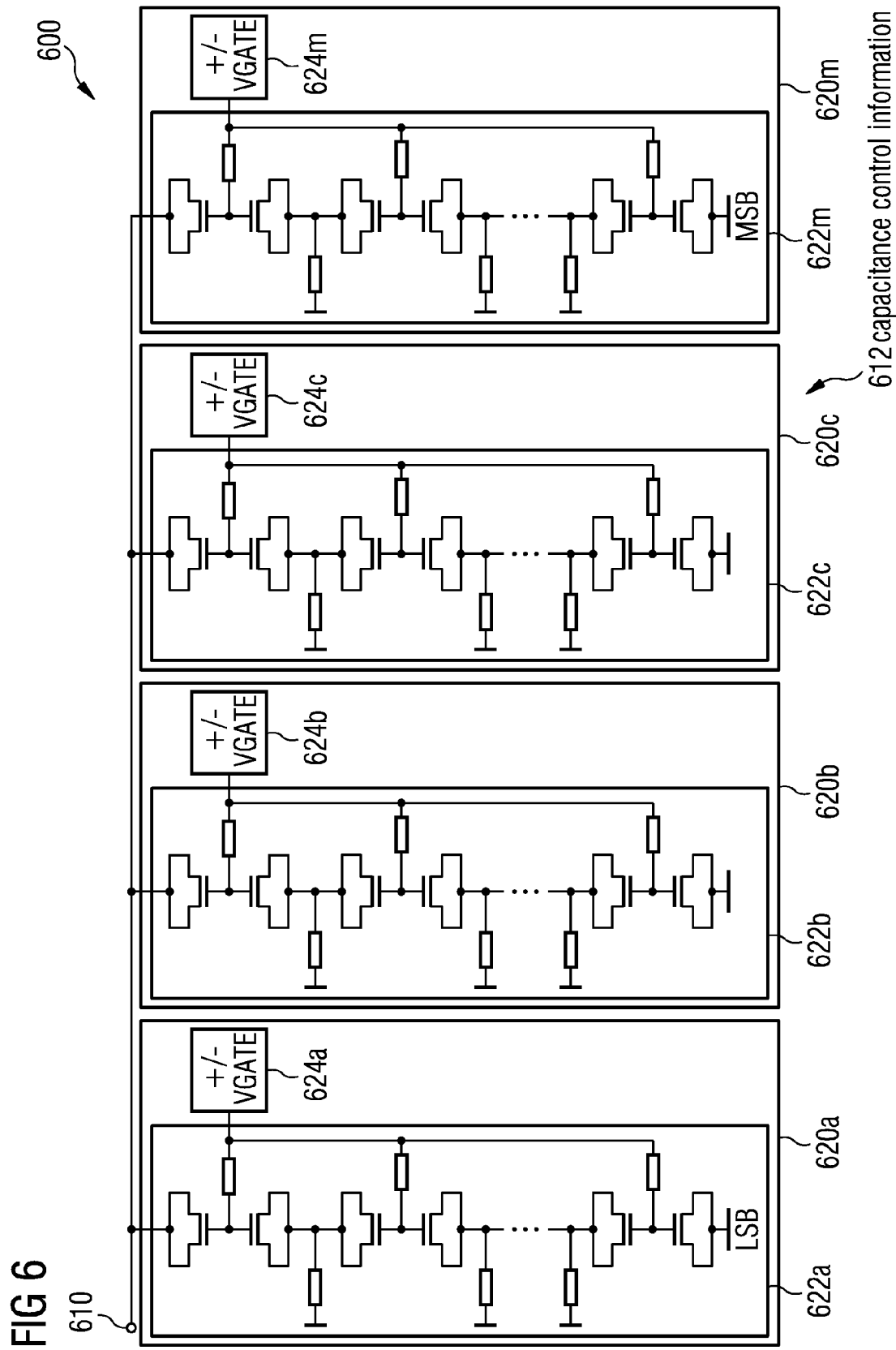

FIG 7A
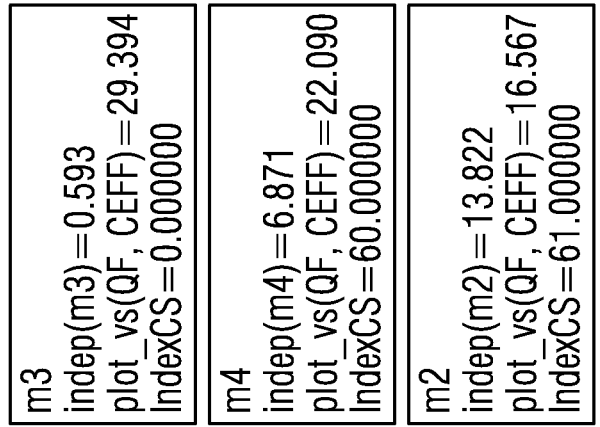
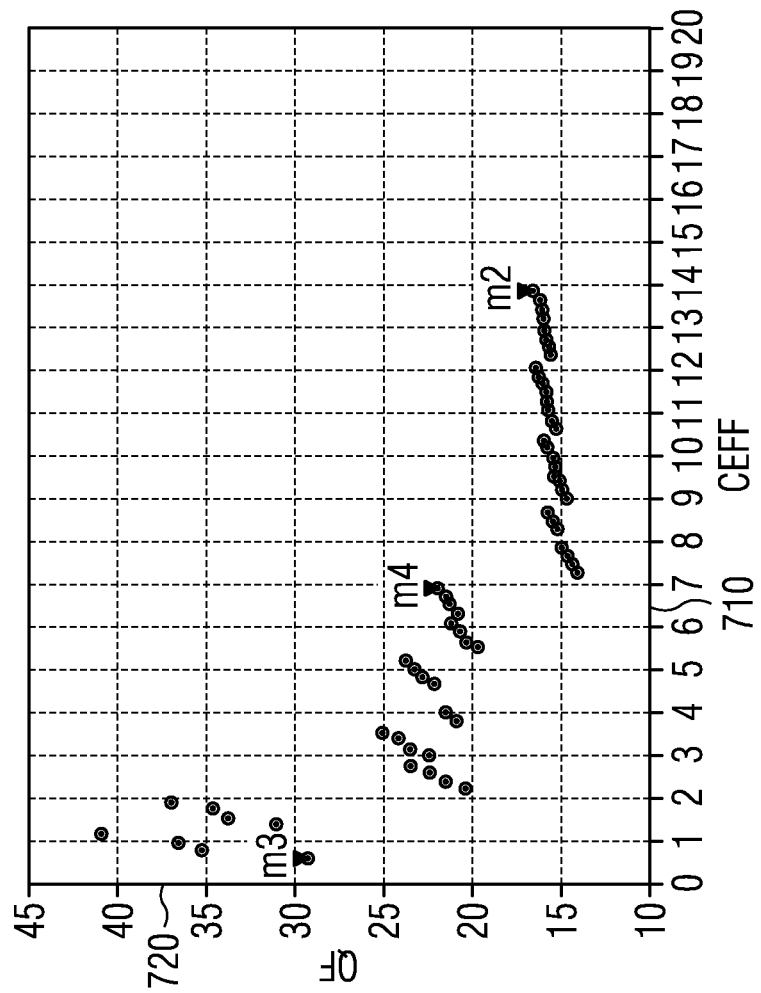

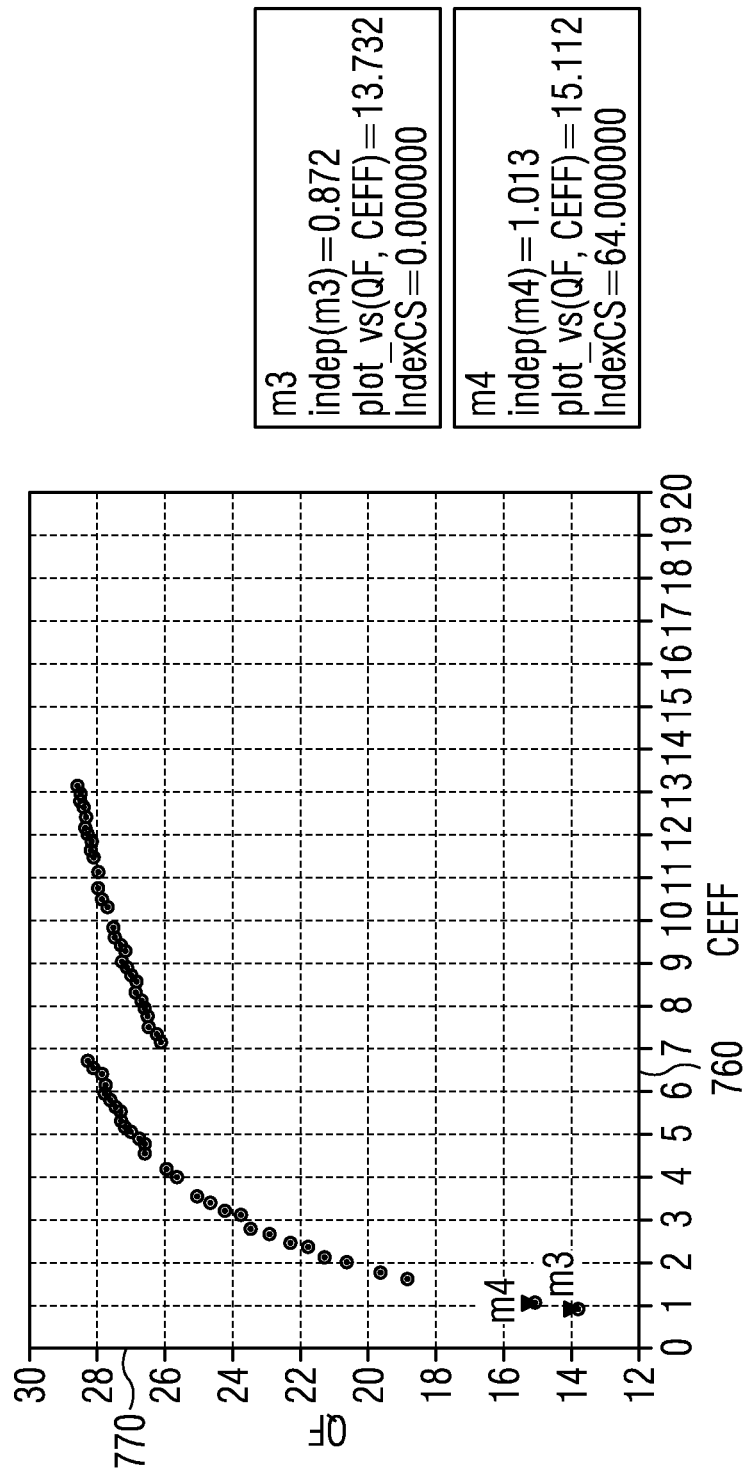

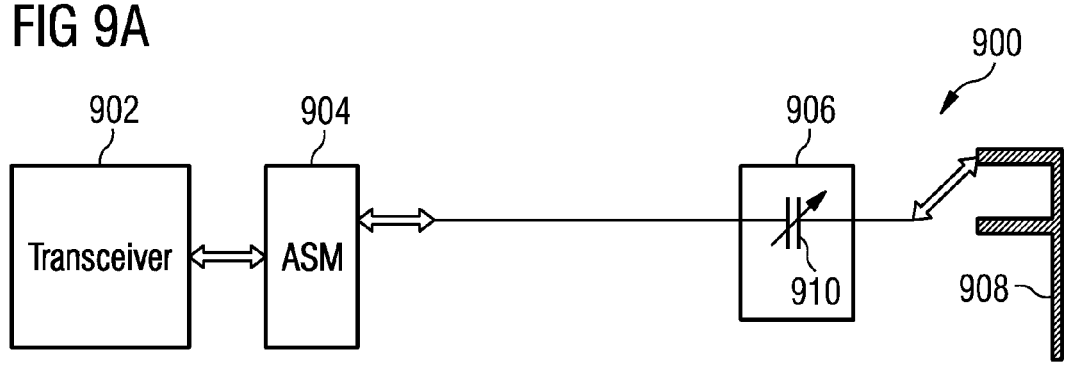
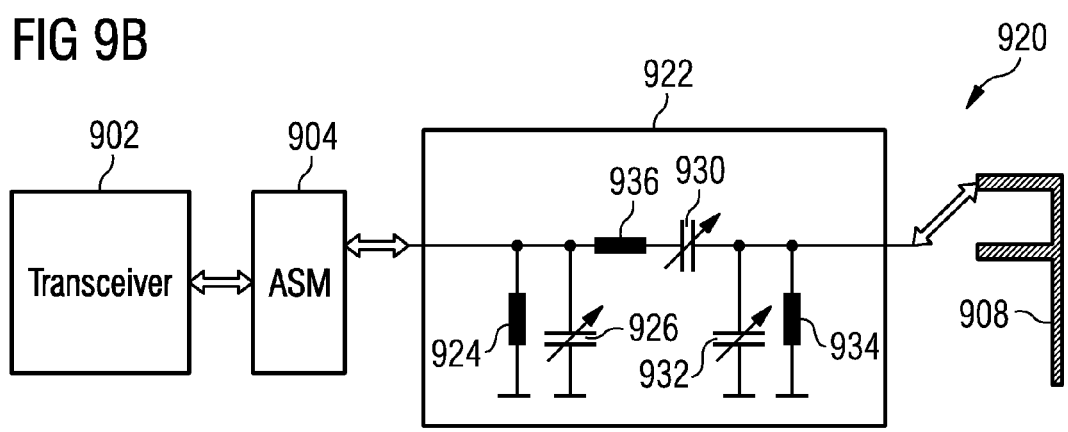
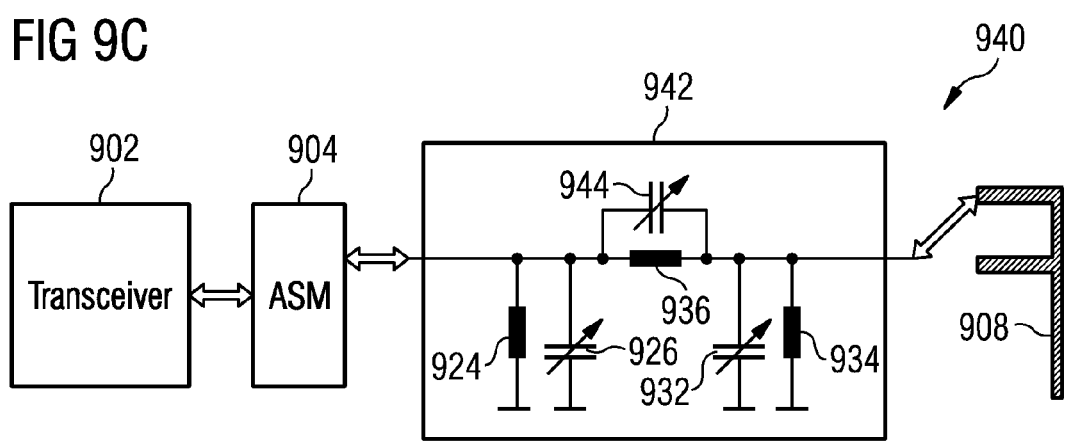

SYSTEM AND METHOD FOR A TUNABLE CAPACITANCE CIRCUIT

TECHNICAL FIELD

Embodiments according to the invention are related to a system and method for a tunable capacitance circuit.

BACKGROUND

In tunable radio frequency circuits (RF circuits), it is desirable to have adjustable impedances. The basic two types of adjustable impedances are inductors and capacitors. In some cases, it is desirable to have capacitors which are suited for handling large signals. This type of tunable capacitors can, for example, be used for antenna radio frequency matching, power amplifier output matching and all kinds of radio frequency filters that can face strong signals. Additionally, high-quality factors are desired in some cases, for example to maintain sharp filter curves and a low insertion loss. Moreover, in some applications, high linearity is desirable. For example, for next generation mobile phone systems, very high linearity requirements may become mandatory.

In view of this situation, there is a desire to have a tunable capacitance which comprises a good trade-off between power handling capability, quality factor and linearity.

SUMMARY OF THE INVENTION

An embodiment according to the invention creates a tunable capacitance circuit comprising a plurality of varactor transistors, which are coupled in series.

Another embodiment according to the invention creates an antenna tuner comprising such a tunable capacitance circuit.

Another embodiment according to the invention creates a method for providing a tunable capacitance. The method comprises providing a first capacitance using a plurality of varactor transistors, which are coupled in series, wherein the varactor transistors are operated at a first bias condition. Moreover, the method comprises providing a second capacitance using the plurality of varactor transistors, wherein the varactor transistors are operated at a second bias condition, which is different from the first bias condition.

BRIEF DESCRIPTION OF THE DRAWINGS

Embodiments according to the present invention will subsequently be described taking reference to the enclosed figures, in which:

FIG. 1 shows a block schematic diagram of a tunable capacitance circuit, according to an embodiment of the invention;

FIG. 2 shows a schematic of a tunable capacitance circuit, according to an embodiment of the invention;

FIG. 6 shows a schematic of a tunable capacitance circuit, according to an embodiment of the invention;

FIG. 7a shows a graphical representation of a quality factor versus a capacitance for a conventional tunable capacitance;

FIG. 7b shows a graphic representation of a quality factor versus a capacitance for a tunable capacitance circuit according to an embodiment of the present invention;

FIG. 9a shows a schematic of an embodiment transceiver system having a tuner circuit that includes a series tunable capacitor element;

FIG. 9b shows a schematic of another embodiment transceiver system having a tuner circuit; and FIG. 9c shows a schematic of a further embodiment transceiver system having a tuner circuit.

Figure 3:
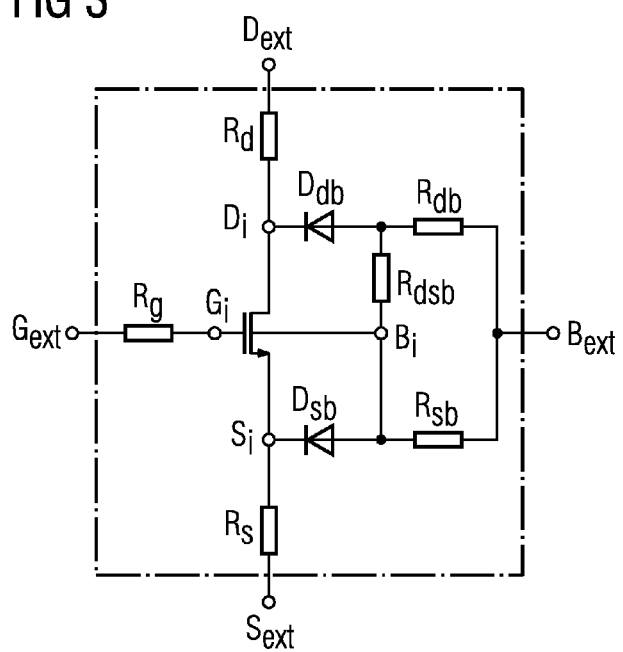
FIG. 3 shows an equivalent circuit of a field-effect transistor in BULK-CMOS.

Corresponding numerals and symbols in different figures generally refer to corresponding parts unless otherwise indicated. The figures are drawn to clearly illustrate the relevant aspects of the preferred embodiments and are not necessarily drawn to scale. To more clearly illustrate certain embodiments, a letter indicating variations of the same structure, material, or process step may follow a figure number.

DETAILED DESCRIPTION OF ILLUSTRATIVE EMBODIMENTS

In the following description, a plurality of details is set forth to provide a more thorough explanation of embodiments of the present invention. However, it will be apparent to those skilled in the art that embodiments of the present invention may be practiced without these specific details. In other instances, well known structures and devices are shown in block diagram form rather than in detail in order to avoid obscuring embodiments of the present invention. In addition, features of the different embodiments described hereinafter may be combined with each other, unless specifically noted otherwise.

Equal or equivalent elements or elements with equal or equivalent functionality are denoted in the following description by equal or equivalent reference numerals.

FIG. 1 shows a block schematic diagram of a tunable capacitance circuit, according to an embodiment of the invention. The tunable capacitance circuit 100 according to FIG. 1 comprises a first varactor transistor 110 and a second varactor transistor 120 coupled in series.

This embodiment according to the invention is based on the finding that a series circuit of varactor transistors, for example, field effect transistors which act as varactor transistors, provides for a good tradeoff between a power handling capability, a quality factor and a linearity. Moreover, the dependency of the capacitance between the a terminal (or, equivalently, a gate electrode or a gate contact) and channel terminals (or, equivalently, channel electrodes or channel contacts) on the bias condition can be exploited to vary the capacitance (or, in some cases, at least the small signal capacitance) presented by the series circuit. Moreover, by coupling a plurality of field-effect transistors, which act as varactor transistors, increases the voltage handling capability (or power handling capability) when compared to a single field-effect transistor. Moreover, it has been found that a reduction of the voltage applied to the individual field-effect transistors (for example, the voltage between the short-circuited channel terminals, for example, drain and source terminals, on the one hand and the gate terminal on the other hand), which is achieved by the series circuit, the linearity characteristics can be improved. Moreover, it has been found that reasonable quality factors can be obtained by such a series circuit of field-effect transistors acting as varactor transistors. Also, it has been found that a series circuit of field effect transistors acting as (or, equivalently, configured as) varactor transistors can be implemented with reasonable technological effort.

Accordingly, the tunable capacitance circuit 100 can be used for large signal applications, and constitutes a large signal suited tunable capacitor. The tunable capacitance circuit 100 can be used for antenna radio frequency matching, power amplifier output matching and all kinds of radio frequency filters that can face a strong radio frequency signal. A high quality factor, which is sufficient for many applications, is provided, such that sufficiently sharp filter curves and a low insertion loss can be maintained in many cases. Moreover, the linearity provided by the tunable capacitance circuit 100 is sufficiently high even for next generation mobile phone systems provided that the component parameters are chosen appropriately.

In other words, the first varactor transistor is a first field effect transistor, and the second varactor transistor is a second field effect transistor, wherein the first field-effect transistor 110 and the second field-effect transistor 120 are configured as a series circuit of varactor transistors.

In some embodiments, the varactor transistors are field effect transistors, wherein a drain terminal of a first of the field effect transistors is coupled with a source terminal of the first of the field effect transistors, such that the first of the field effect transistors acts as a first varactor transistor. Also, a drain terminal of a second of the field effect transistors may be coupled with a source terminal of the second of the field effect transistors, such that the second of the field effect transistors acts as a second varactor transistor.

In other words, the varactor transistors are may be "normal" field effect transistors, which are electrically connected in a specific manner, as described herein.

FIG. 2 shows a schematic diagram of a tunable capacitance circuit 200, according to an embodiment of the invention. The tunable capacitance circuit 200 comprises a first terminal (or, more generally, electrical connection) 210 and a second terminal (or, more generally, electrical connection) 212, wherein the first electrical connection 210 and the second electrical connection 212 are typically connections for a high frequency signal path. The tunable capacitance circuit 200 also comprises a bias voltage terminal (or, more generally, an electrical connection for a bias voltage) 214. The tunable capacitance circuit 200 comprises a series connection 220 of field-effect transistors, which act as (or, worded differently, are configured as) varactor transistors (i.e., as adjustable capacitances formed using the field-effect transistors). The series circuit 200 comprises a plurality of pairs 222a, 222b, . . . , 222n of field-effect transistors. However, it should be noted that an odd number of field-effect transistors can also be used. For example, the series circuit 200 comprises a first field-effect transistor T1, a second field-effect transistor T2, a third field-effect transistor T3, a fourth field-effect transistor T4, etc. For example, the series circuit 220 may also comprise a (2n−1)-th field-effect transistor T2n−1 and a 2n-th field-effect transistor T2n. For example, n may be an integer number. However, it is not required that the number of field-effect transistors is even. The even configuration has the advantage, that the amount of resistors for the gate and source-drain contacts can be minimized, thus also parasitics from nonideal resistors reduce.

Another advantage placing Source/Drain towards the connection pin is from ESD point of view, no direct gate connection.

For example, a drain terminal 231a of the field-effect transistor T1 may be coupled (or even directly connected) with a source terminal 231b of the first field-effect transistor T1. Moreover, the drain terminal 231a and the source terminal 231b of the first field-effect transistor T1 may be coupled with the first terminal (or electric connection) 210. A gate terminal 231c of the first field-effect transistor T1 may be coupled with a gate terminal 232c of the second field-effect transistor T2. A drain terminal 232a of the second field-effect transistor T2 may be coupled with a source terminal 232b of the second field-effect transistor T2. Moreover, a drain terminal 233a of the third field-effect transistor T3 may be coupled with a source terminal 233b of the third field-effect transistor T3. Moreover, the drain terminal 233a and the source terminal 233b of the third field-effect transistor T3 may be coupled (or even directly connected) with the drain terminal 232a and the source terminal 232b of the second field-effect transistor T2. A gate terminal 233c of the third field-effect transistor T3 may be coupled with a gate terminal 234c of the fourth field-effect transistor T4. A drain terminal 234a may be coupled with a source terminal 234b of the fourth field-effect transistor T4. Moreover, the drain terminal 234a and the source terminal 234b of the fourth field-effect transistor T4 may, for example, be coupled with another pair of field-effect transistors, or, in the absence of another pair of field-effect transistors, with the pair 222n of field-effect transistors, or, in the absence of the pair 222n of field-effect transistors, with the second terminal (or electrical connection) 212. However, in the presence of the pair 222n of field-effect transistors, a drain terminal 237a may be coupled with a source terminal 237b of the transistor T2n−1. Moreover, the drain terminal 237a and the source terminal 237b of the field-effect transistor T2n−1 may be coupled directly, or via one or more additional pairs of field-effect transistors acting as varactors, with the drain terminal 234a and the source terminal 234b of the fourth field-effect transistor T4. A gate terminal 237c of the transistor T2n−1 is coupled with a gate terminal 238c of the field-effect transistor T2n. A drain terminal 238a of the transistor T2n is coupled with a source terminal 238b of said transistor, and both the drain terminal 238a and the source terminal 238b of the transistor T2n are coupled with the second terminal (or second electrical connection) 212.

To summarize, the tunable capacitance circuit 200 comprises a series connection of a plurality of pairs 222a, 222b, 222n of field-effect transistors, wherein each of the field-effect transistors is configured as (and thus acts as) a varactor transistor. To operate the field-effect transistors T1 to T2n as varactor transistors, drain terminals and source terminals are coupled (for example, directly connected) such that a capacitance between the gate terminal on the one hand and the channel terminals (drain terminal and source terminal) on the other hand is effective. The capacitance provided between the gate terminal of the respective field-effect transistor and the channel terminals (drain terminal and source terminal) of the respective field-effect transistor is dependent on the bias voltage applied to the respective field-effect transistor (wherein the bias voltage may be equal to the gate source voltage which, in the actual configuration shown in FIG. 2, is substantially identical to the gate drain voltage. Moreover, it can be seen that, in the tunable capacitance circuit 200, gate electrodes of pairs of "subsequent" field-effect transistors (subsequent in the order of the series connection) are coupled (for example, directly connected). Moreover, it can also be seen that both channel terminals (drain terminals and source terminals) of two subsequent field-effect transistors (subsequent in the order of the series connection) are coupled (for example, directly connected) to a common node in the tunable capacitance circuit 200 according to FIG. 2. Thus, along the series circuit of field-effect transistors, there is an alteration of nodes to which gate electrodes of subsequent field-effect transistors (for example, T1 and T2) are connected and nodes to which channel terminals of subsequent field-effect transistors (for example, T2 and T3) are coupled (or directly connected). However, it should be noted that a different style of the series connection could also be used in some embodiments.

Moreover, it should be noted that electrical nodes, to which channel terminals of field-effect transistors are coupled, are coupled to a reference potential (for example, ground potential) via so-called discharge resistors. For example, an electrical node 240, to which the channel terminals of transistors T2 and T3 are coupled, is coupled to a reference potential via a discharge resistor 242, or, more generally, via a discharge impedance element. Similarly, an electrical node 244, to which channel terminals of the field-effect transistor T4 are coupled, is coupled to the reference potential via a discharge resistor 246. Moreover, an electrical node 248, to which channel terminals of the field effect transistor T2n−1 are coupled, is coupled to the reference potential via a discharge resistor 250.

A node 252, at which the channel terminals of the transistor T2n and the second electrical terminal 212 are coupled, may optionally be coupled to the reference potential via the discharge resistor 254.

Moreover, it should be noted that electrical nodes, at which the gate terminals of "subsequent" field-effect transistors (subsequent in the order of the series connection) are coupled, are coupled with the bias voltage terminal 214 via bias resistors. For example, the gate electrodes 231c, 232c of transistors T1, T2 are coupled to the bias voltage terminal 214 via a bias resistor 260. Similarly, the gate electrodes 233c, 234c of field effect transistors T3 and T4 are coupled to the bias voltage terminal 214 via a bias resistor 262, and the gate electrodes 237c, 238c of field-effect transistors T2n-1 and T2n are coupled with the bias voltage terminal via bias resistor 264. Accordingly, it is possible to apply the same bias potential to the gate terminals of all field-effect transistors of the tunable capacitance circuit 200. However, the application of individual bias voltages to single field effect transistors or groups of field effect transistors is also possible in some embodiments.

Regarding the functionality of the tunable capacitance circuit, it should be noted that a capacitance between the first electrical terminal 210 and the second electrical terminal 212 is formed by a series connection of the individual capacitances between the gate electrode and the channel electrodes of the respective transistors T1 to T2n. A comparatively small portion of a radio frequency signal applied between the first electrical terminal 210 and the second electrical terminal 212 is lost via the discharge resistors 242, 246, 250 and 254, and via the bias resistors 260, 262, 264. However, a loss of a radio frequency signal is limited to an acceptable degree by choosing the values of the discharge resistors and of the bias resistors sufficiently large.

Moreover, it should be noted that the capacitance between the gate electrode and the channel electrodes of the respective field-effect transistors T1 to T2n can be adjusted or switched between two values) by an appropriate choice of the bias voltage applied at the bias voltage terminal 214 (or to the individual gate-source paths of the field effect transistors). In other words, a bias voltage between the gate electrode and the channel electrodes of the respective field-effect transistors T1 to T2n can be set via the bias voltage provided (for example, using a bias voltage provider) at the bias voltage terminal 214. Thus, the field-effect transistors T1 to T2n can be brought to a desired operating point (for example, an inversion mode of operation or an accumulation mode of operation) by choosing an appropriate bias voltage. Accordingly, the capacitance between the gate terminal and the channel terminals of the respective field-effect transistor T1 to T2n can be varied (for example, switched between two values). Consequently, an effective capacitance between the first electrical terminal 210 and the second electrical terminal 212 can also be varied or switched between two values.

Moreover, it should be noted that the gate-source voltages of the field effect transistors T1 to T2n may be adjusted, or switched between two states, commonly (for example, using a common gate bias voltage, which is coupled to the gates of all field effect transistors T1 to T2n via the gate impedance elements), pair-wisely (for example, using a common gate bias voltages for pairs of two transistors), or individually (for example, using individual gate bias voltages for individual transistors). In other words, there may be a common control voltage provider for all field effect transistors in some implementations, or there may be a plurality of control voltage providers, each associated with one or more of the filed effect transistors. In the latter case, an even finer adjustment of the capacitance may be reached. Also, it should be noted that the presence of a plurality of control voltage providers (which may be controlled, or switched between two states, individually) is substantially equivalent to a series circuit of multiple tunable capacitance circuits.

Moreover, it should be noted that the circuit elements of the tunable capacitance circuit 200 are may be designed such that a high-frequency voltage swing caused by a high-frequency voltage applied between the first electrical terminal 210 and the second electrical terminal 212 is distributed approximately equally to the transistors T1 to T2n. In other words, the values of the discharge resistors and of the bias resistors may be chosen to be large enough, such that the high-frequency voltages across the gate-channel paths of the field-effect transistors T1 to T2n are at least approximately (for example, within a tolerance of 10% or 20%) equal. Accordingly, a voltage swing applied to the gate-channel path of an individual one of the field-effect transistors T1 to T2n is typically only a fraction of a high-frequency voltage swing applied between the first electrical terminal 210 and the second electrical terminal 212. Accordingly, a voltage handling capability of the tunable capacitance circuit 200 is substantially larger (ideally, by a factor which is equal to a number of varactor transistors coupled in series) than a voltage handling capability of a single one of the field-effect transistors. Thus, a comparatively high power handling capability can be reached, even though the sensitive gate insulator of the individual field effect transistors is used to form the capacitance.

In the following, some additional considerations and implementation aspects, which can be applied in the design of the tunable capacitance circuit 200, will be explained.

The tunable capacitance circuit 200 is based on the idea that a varactor can be designed using a CMOS transistor. In principle, if a metal-oxide-semiconductor device (MOS device) is used, source and drain contacts (also designated herein as source and drain terminals) are connected together. In this case, a main capacitance is found between the gate and the source-drain channel.

Figure 4:
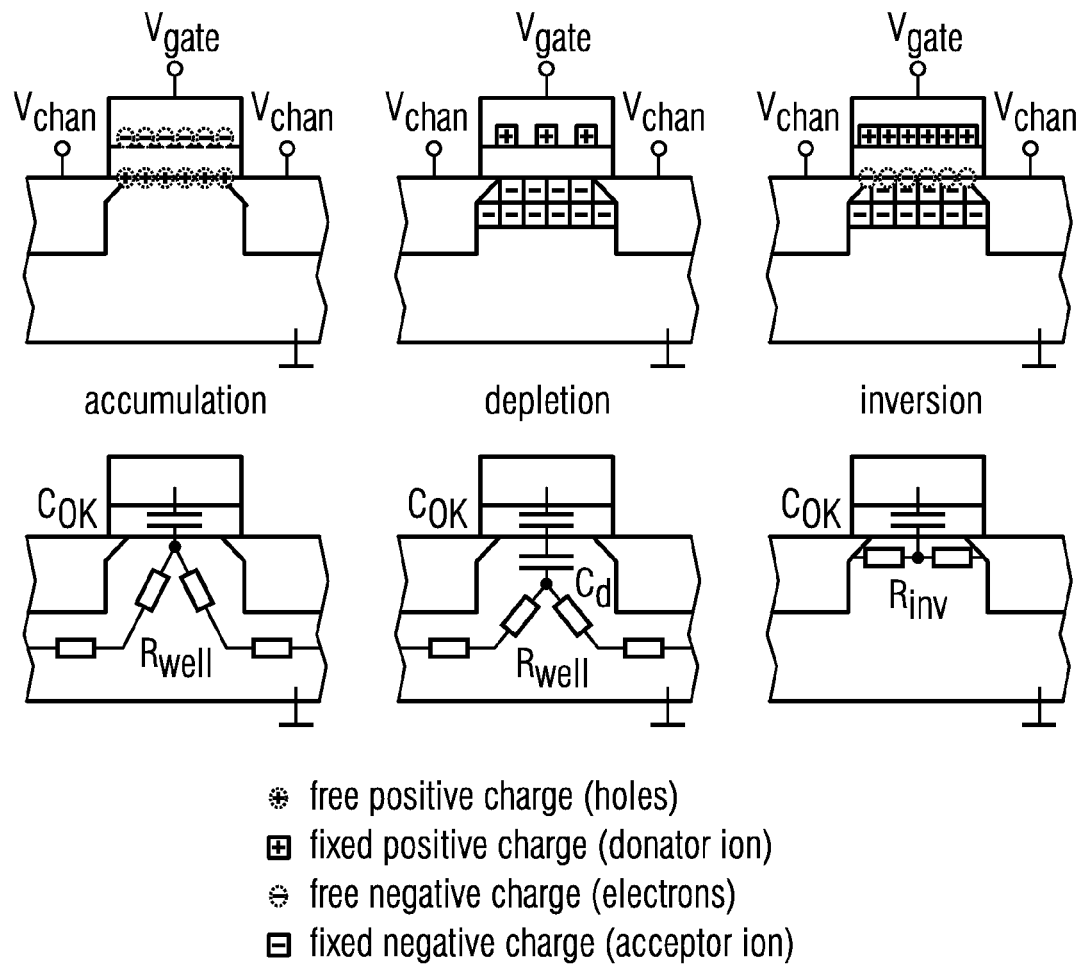
FIG. 4 shows a graphical representation of different bias conditions of a field-effect transistor.

As can be seen in FIG. 4, different biasing conditions can be reached. For example, when a negative gate voltage (or gate source voltage) is applied, an accumulation state can be reached (for example, in a N-channel field effect transistor). In this case, the oxide capacitance $C_{ox}$ and a well-resistance are effective. If a gate voltage of the order of the threshold voltage (or slightly below the threshold voltage) is applied (for example as a gate source voltage), a depletion state is reached. In this case, the oxide capacitance $C_{ox}$, a depletion capacitance $C_d$ and a well resistance $R_{well}$ is effective. Moreover, if a positive gate source voltage (for example, above the threshold voltage) is applied, an inversion state can be reached. In this case, the oxide capacitance $C_{ox}$ and an inversion state resistance $R_{inv}$ become effective. Moreover, additional capacitances are also active, for example a gate-drain capacitance and a gate-source capacitance, which can not be neglected and will be explained below. Accordingly, an effective capacitance between the gate terminal and the channel terminals (drain terminal and source terminal) of the field-effect transistor varies in dependence on the applied gate source voltage (or gate channel voltage).

In other words, applying a bias voltage on the gate (or a bias voltage between gate and source) causes a change in the resulting capacitance. Two main capacitance contributions are found:

In the inversion mode, the gate to channel capacitance; and

In accumulation (negative bias), the source/gate and gate/drain overlap capacitance.

There exist several modes (for example, operating modes) and types of varactors, depending on an operation range and a transistor type (NMOS or PMOS).

One important design aspect in general is the limited gate/source voltage. Due to the typically very thin gate oxide (of an MOS device), a reliably problem should be solved. To avoid degradation, a maximum gate/source voltage is typically limited. For example, for a typical 130 nm process devices a maximum DC voltage would be 1.5V.

However, it has been found that field-effect transistors (for example, MOS field-effect transistors, which act as varactor transistors, can be stacked. To enable such a structure, it is advantageous to use an isolator substrate. For example, a silicon-on-glass substrate can be used. However, it is also possible to implement such a structure in Bulk-MOS.

Also, it has been found that it is possible to take over technology from radio frequency switches, even though they use a substantially different transistor configuration, since radio frequency switches overcome the problem of high radio frequency voltage by "stacking" as well. A radio frequency voltage is spread over several transistors by their parasitic capacitances. Hence, even 48V radio frequency voltage can be handled by the use of, for example, 32 transistors, which are capable to handle a voltage of 1.5V (also briefly designated as "1.5V transistors"). However, in such a configuration, it is desirable that the substrate diodes are inactive. For this purpose, a silicon-on-isolator process (or, generally, a semiconductor-on-isolator process) can be used with a negative body voltage. Alternatively, the whole bulk can be biased negative. To facilitate the understanding, reference is made to FIG. 3, which shows a typical NMOS equivalent circuit. In FIG. 3, B (for example, $B_i$ or $B_{ext}$) represents the (internal or external) bulk contact. In bulk CMOS, this contact is may be coupled to the substrate, whereas in a silicon-on-isolator (or semiconductor-on-isolator) technology, the bulk contact may be coupled individually.

To avoid the influence of the substrate diodes (for example, diodes $D_{sb}$ and $D_{db}$), a negative voltage is applied to the bulk contact (B contact), for example of transistors T1 to T2n. Hence, the source-drain channel can conduct positive and negative voltage without distortions, using the high ohmic substrate as body resistor and a negative voltage. It is apparent that this device is as well limited by the DC reliability; again, a radio frequency voltage should not exceed the allowed gate/source/drain voltages.

Taking reference now to a comparison example of a radio frequency switch, it should be noted that it is possible to stack several of these devices (for example, MOS field-effect transistors). For example, reference is made to the comparison example shown in FIG. 8. As can be seen, channel terminals of the stacked field-effect transistors are coupled to a reference potential. Moreover, gate terminals of the stacked field-effect transistors are coupled to a gate voltage source via high-Ohmic gate resistors. Moreover, parasitic gate drain capacitances and gate source capacitances (also designated as "parasitic overlap capacitances") are shown in FIG. 8.

Figure 8:
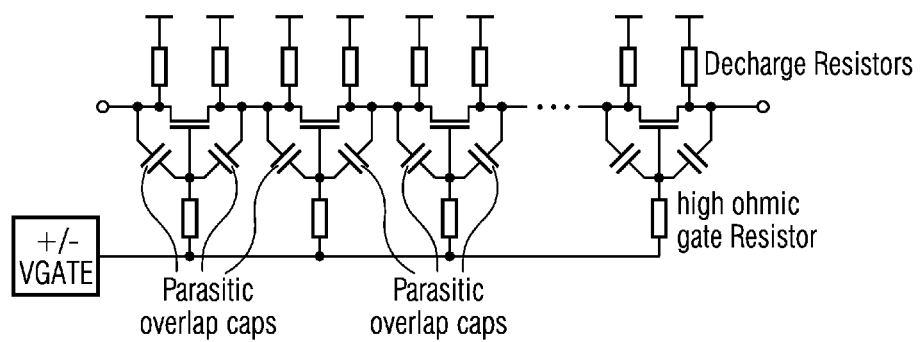
FIG. 8 shows a schematic of a RF switch, according to a comparison example.

In the comparison example of FIG. 8, in an ON mode, a positive gate voltage switches on the channels (of the field-effect transistors) and hence no high radio frequency voltage can be seen at the transistor itself. In the OFF mode, a negative voltage (for example, a voltage below the threshold voltage) is present at the gates. A high voltage can be split over the present parasitic capacitances (for example, gate source capacitances and gate drain capacitances). Due to the high-Ohmic resistors (for example, discharge resistors and gate resistors), the circuit is floating with the radio frequency, and each device is only exposed to a small part of the radio frequency voltage swing. If a switch according to the comparison example of FIG. 8 is designed, a tradeoff between maximum voltage swing, a transistor size and OFF capacitance should be made.

In some embodiments, stacking varactors (for example, field-effect transistors acting as varactor transistors) may be implemented in a "switch process" (for example, in a process which is similar to a process according to which radio frequency switches are fabricated, which means, for example, using a high ohmic substrate material as well as an isolation feature for logic devices such as a triple-well) using a negative bulk or body bias to remove the substrate diodes (or, at least, the detrimental effect of the substrate diodes). Additionally, the impedances "Z" (also designated as impedance elements) may be simply high-Ohmic resistors, similar like in a radio frequency switch (for example, in the radio frequency switch according to the comparison example of FIG. 8).

FIG. 2 illustrates an embodiment tunable capacitance circuit in which field-effect transistors T1 to T2n acting as varactor transistors are basically stacked. Each transistor T1 to T2n is operated as a varactor, for example, with a maximum gate voltage (or a gate source voltage) of 1.5V. Stacking, for example, 32 field-effect transistors T1 to T2n (for example, with n=16) will give again 48V of radio frequency voltage (i.e., will allow to apply a radio frequency voltage having an amplitude of 48V between the first electrical terminal 210 and the second electrical terminal 212). Additionally, the connection points (for example, the electrical nodes to which the source terminals and drain terminals of subsequent transistors are coupled) have a source/drain connection, which is inherently an electrostatic discharge (ESD) protection, due to the substrate diodes. It should be noted that the substrate diodes are typically not biased while mounting the device, such that the substrate diodes may act as an electrostatic discharge protection under these conditions.

In some embodiments, the field-effect transistors T1 to T2n are stacked "gate-to-gate" such that the gates of a pair of subsequent (subsequent in the order of the series connection) field-effect transistors are coupled (or directly connected), as shown in FIG. 2. The reason of stacking gate-to-gate lies in that this stacking "gate-to-gate" allows to save to the amount of gate resistors (i.e., to keep the number of gate resistors small). This is an advantage in terms of size and improves the quality factor for low capacitances. Furthermore, nonlinear products (harmonics) may also be canceled by using this anti-series configuration.

It should be noted that, the more of these resistors are used (which may be necessary due to the stacking) the lower the overall resistance R will be (due to parallel operation). In some cases, this lower resistance R may act as a radio frequency leakage and causes losses, which result in a quality factor (Q) drop. In case the imaginary part is low (low capacitance C), the quality factor (Q) drop will be higher than for higher C values.

In some embodiments, a comparatively small number of bias impedance elements (e.g., bias resistors) 260, 262, 264 may be used along with comparatively large resistance values (for example, of the order of 200 kOhm or more) to avoid radio frequency leakage, and to thereby obtain a high quality factor. For example, the bias resistors 260, 262, 264 may have a resistance of 400 kOhm each. Similarly, the a number of the discharge resistors (or discharge impedance elements) 242, 246, 250, 254 may be kept reasonably small in some embodiments. For example, the resistance values of the discharge resistors 242, 246, 250, 254 may be chosen, for example, to be larger than 200 kOhm. In a specific embodiment, the discharge resistors 242, 246, 250, 254 may have a value of 400 kOhm.

In some embodiments, an analog tuning voltage or bias voltage may be applied at the bias voltage terminal 214, to provide for a continuous or quasi-continuous adjustment of the gate bias voltage (or gate-source bias voltage) of the field-effect transistors T1 to T2n.

However, in some embodiments, instead of using an analog tuning voltage, a digital control approach may be used. In some cases, using digital control may provide for high linearity and high tolerance of process and environmental variation. In such embodiments, instead of using an analog capacitance tuning signal $C_{Tune}$ the transistors may be switchably biased with a negative or positive fixed bias (for example, −1.5V or +1.5V), where a C(V) characteristic (for example, a characteristic which describes a relationship between a gate-source voltage and a capacitance between the gate terminal and the short-circuited channel terminals) is (at least substantially) saturated and does not change anymore (for comparatively small changes of the gate-source voltage). A result of that consideration is that a digital control and two "fixed" capacitor values (wherein a switching is performed between these two "fixed" capacitance values) may be used. In other words, the gate bias voltage, which is applied to the bias voltage terminal 214, is switched between two discrete values ("digital control"), such that each of the field-effect transistors T1 to T2n is switched between two (discrete) capacitance states (which results in two discrete, "fixed", capacitor values which can be measured between the first electrical terminal 210 and the second electrical terminal 212). In some embodiments, the circuit may tolerate high radio frequency voltages, as the parasitic capacitances can no more tune C(V). In other words, since the field-effect transistors T1 to T2n are operated at two discrete operating points, where the capacitance exhibits small (or even negligible) dependency on the gate source voltage, the capacitance does not change substantially by applying a radio frequency voltage (which "modulates" the gate source voltage), which in turn keeps non-linear effects (which would be caused by a time-variation of the capacitance) small.

Moreover, it has been found that linearity may be further improved by an appropriate selection of a ratio between channel width and channel length (briefly designated as W/L). Instead of using a "lowest" gate length, a higher gate length (which is typically substantially higher than the minimum gate length which can be obtained using a specific technology) may be used. The reason for this is the stacked nature of the structure. To obtain reasonable capacitances after stacking (for example, 32 times), each single capacitance may be made sufficiently high. Considering the varactor circuit, in which the field-effect transistors are used, shows that the contribution (for example, a relative contribution of the parasitic capacitance due to the overlap gate/source) to the complete capacitance may be reduced by using a (comparatively) high gate length. Hence, it is possible to tradeoff between a minimum capacitance $C_{min}$ and maximum capacitance $C_{max}$. The higher the tuning ratio, the larger the gate length should be. To obtain a high quality factor a large amount of gate contacts to the metal layer may be used in embodiments in which the process technology uses resistive gate poly, thereby making one plane of the capacitance is resistive.

Figure 5:
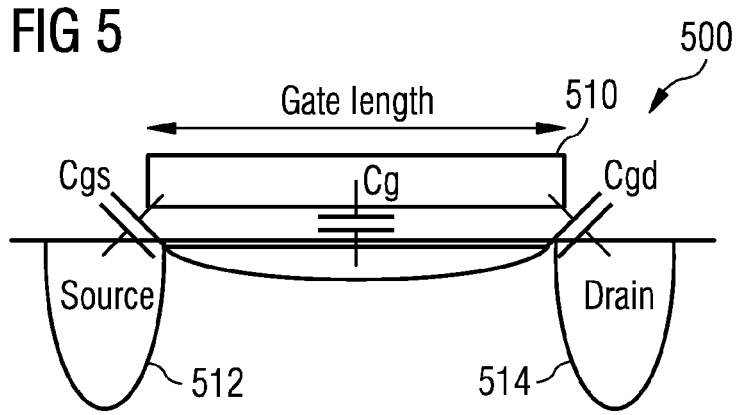
FIG. 5 shows a schematic representation of capacitances in a field-effect transistor.

Taking reference now to FIG. 5, which shows a schematic representation of capacitances in a field-effect transistor, the situation will be briefly explained. As can be seen, the field-effect transistor 500 as shown in FIG. 5 comprises a gate electrode 510, a source region 512 and a drain region 514. The gate electrode 510 comprises a gate length, which is considered as an extension of the gate electrode in a direction from the source region to the drain region. As can be seen, there is a (parasitic) gate source capacitance $C_{gs}$ between the gate electrode 510 and the source electrode 512. Also, there is a (parasitic) capacitance between the gate electrode 510 and the drain region 514. Moreover, there is a gate-channel capacitance $C_g$ between the gate electrode and the channel region. As can be easily understood, the gate source capacitance and the gate drain capacitance are substantially caused by the proximity of the gate electrode and the source region, and also by the proximity of the gate electrode and the drain region. However, the gate source capacitance and the gate drain capacitance do not scale strongly with the gate length. In contrast, the gate-channel capacitance scales with the gate length. Moreover, it should be noted that the gate source capacitance and the gate drain capacitance are important (or dominant) contributions to the minimum capacitance $C_{min}$. In contrast, the gate channel capacitance is an important (or dominant) contribution to the maximum capacitance. Thus, to obtain a large tuning range, a large ratio between the gate-channel capacitance $C_g$ and the gate source capacitance and gate drain capacitance may be used in some embodiments. This may be achieved, for example, by using a comparatively large gate length, which is substantially larger (for example, at least by a factor of 10) than a minimum gate length obtainable using a given technology.

Moreover, since the gate electrode 510 is typically formed using a poly-silicon in some technologies, and consequently comprises a significant resistance, a large number of gate contacts may be used. These gate contacts may connect the gate electrode 510 with a highly conductive material such as metal of a metallization layer. Accordingly, losses due to the resistance of the gate electrode may be reduced, in order to achieve a higher quality factor.

In the following, some of the design considerations underlying the tunable capacitance circuit 200 will be summarized.

Generally speaking, the tunable capacitance circuit 200 comprises a plurality of varactor transistors T1 to T2n, which are coupled in series to act as a series circuit of varactor transistors. For example, the transistors T1 to T2n can act as varactor transistors because their channel terminals (drain terminal and source terminal) are connected, and because the capacitance between the gate terminal and the channel terminals is exploited. Moreover, the capacitance between the gate terminal and the channel terminals can be adjusted by varying a bias, such that the field-effect transistors T1 to T2n act as variable capacitors, and can therefore be considered as varactor transistors.

In an implementation, the field-effect transistors T1 to T2n are formed in or on a substrate, wherein the substrate is biased such that drain bulk diodes and source bulk diodes (generally: drain-substrate diodes and source-substrate diodes) of the field-effect transistors T1 to T2n are reverse biased. The substrate connections are not shown in FIG. 2 in for the purpose of illustration, but the provision of a negative bias to the substrate (or to the bulk contacts of the field effect transistors) may be implemented using circuits and systems known in the art.

In an implementation, the substrate may be a silicon substrate having a resistivity of at least 500 Ohm cm, which results in good radio frequency characteristics.

In another implementation, the field-effect transistors may be formed in or on a substrate, wherein the substrate is a semiconductor-on-isolator substrate (or a silicon-on-isolator substrate). In this case, a body region may be biased such that drain-body diodes and source-body diodes of the field-effect transistors are reverse biased. Accordingly, a negative swing of a radio frequency voltage applied to the electrical terminals 210, 212 can be tolerated. For example, a negative potential (relative to a reference potential or ground potential) may be applied to the body regions, for example using body contacts.

In an implementation, a source terminal 231b of the first field-effect transistors T1 is coupled with a drain terminal 231a of the first field-effect transistor T1, a source terminal 232b of the second field-effect transistor T2 is coupled with the drain terminal 232a of the second field-effect transistor T2, and the gate terminal 231c of the first field-effect transistor T1 is coupled with the gate terminal 232c of the second field-effect transistor. Accordingly, the first field-effect transistor T1 acts as a first varactor transistor, and the second field-effect transistor T2 acts as a second varactor transistor. A capacitance of the first field-effect transistors T1 (for example, a capacitance between the gate electrode 231c and the channel electrodes 231a, 231b) depends on a gate-source bias voltage applied to the first field-effect transistor T1. Moreover, the capacitance of the second field-effect transistor T2 (for example, a capacitance between the gate electrode 232c and the channel electrodes 232a, 232b) also depends on a gate source bias voltage applied to the second field-effect transistor T2. Accordingly, a variable capacitance sub-circuit comprising transistors T1, T2 is provided, which can form the smallest unit of the tunable impedance circuit, and which can be repeated multiple times, as shown in FIG. 2.

In other words, in an implementation, the tunable capacitance circuit comprises a plurality of varactor transistor pairs (T1, T2); (T3, T4); (T2n−1, T2n) which are coupled in series to act as a series circuit of pairs of varactor transistors. For example, a first pair 220 comprises a first field-effect transistor T1 and a second field-effect transistor T2, and a second pair comprises the third field-effect transistor T3 and the fourth field-effect transistor comprises T4. As can be seen in FIG. 2, a drain terminal and a source terminal of the first field-effect transistor T1 are coupled, and a gate terminal of the first field-effect transistor T1 is coupled with a gate terminal of the second field-effect transistor T2. A source terminal of the second field-effect transistor T2 is coupled with a drain terminal of the second field-effect transistor T2, with a source terminal of the third field-effect transistor T3 and with a drain terminal of the third field-effect transistor T3. A gate terminal of the third field-effect transistor T3 is coupled with a gate terminal of the fourth field-effect transistor T4, and a source terminal of the fourth field-effect transistor T4 is coupled with a drain terminal of the fourth field-effect transistor T4.

In an implementation, the source terminal and the drain terminal of the first field-effect transistor T1 are coupled to a reference potential via a first impedance element (not shown in FIG. 2). Moreover, a source terminal and a drain terminal of the second field-effect transistor T2 are coupled to the reference potential via a second impedance element 242 (which may be a discharge resistor 242). Accordingly, an appropriate biasing of the field-effect transistors can be achieved.

In an implementation, a gate terminal of the first field-effect transistor T1 is coupled to a control voltage provider (which is not shown in FIG. 2, and which is typically coupled to the bias voltage connection 214, and sometimes also designated as a bias voltage provider) via a first impedance element 260. A gate terminal of the second field-effect transistor T2 is coupled to the control voltage provider (not shown in FIG. 2) via the first impedance element 260 (also designated as bias impedance element or bias resistor). Alternatively, the gate terminal of the second field-effect transistor T2 may be coupled to the control voltage provider via a second impedance element.

In an implementation, the tuning capacitance circuit includes a control voltage provider (which is not shown in FIG. 2, but which is typically coupled to the bias voltage terminal 214). The control voltage provider is configured to switch the control voltage, which is applied to the gate terminals of the field-effect transistors T1 to T2n between two discrete values (for example, between +1.5V and −1.5V, or, more generally, between a first voltage, which is above a threshold voltage of the field-effect transistors T1 to T2n and a second voltage which is below the threshold voltage of the field-effect transistors T1 to T2n).

For example, the control voltage provider may be configured to provide the control voltage such that the field-effect transistors T1 to T2n are operated in an inversion mode for the first discrete value, and such that the field-effect transistors are operated in an accumulation mode for the second discrete value. In some embodiments, the capacitance between the gate electrode and the channel electrodes of the field-effect transistors T1 to T2n is substantially independent from the high-frequency voltage, which avoids undesired non-linear effects.

In an implementation, a channel length of the field-effect transistors T1 to T2n is larger than 5 μm. In another implementation, the channel length of the field-effect transistors is even larger than 10 μm. Accordingly, a good ratio between a maximum capacitance (or a capacitance in a first bias state) and a minimum capacitance (or a capacitance in a second bias state) can be reached. In one example a maximum to minimum capacitance ratio may be greater than about 3.5, for example about 10. However, in some embodiments a ratio of two or greater may also be used.

In an implementation, the field-effect transistors are designed such that a ratio between a gate-source capacitance in a first bias state, in which the capacitance takes a maximum value, and a gate-source capacitance in a second bias state, in which the capacitance takes a minimum value, is at least equal to 3. In some embodiments, this ratio may be two or greater. Accordingly, a reasonable capacitance variation may be achieved. For example, this condition can be fulfilled by an appropriate choice of the channel length and the channel width.

In the following, another embodiment according to the invention is described with reference to FIG. 6.

FIG. 6 shows a schematic diagram of a tunable capacitance circuit, according to an embodiment of the invention. The tunable capacitance circuit 600 includes an input connection or radio frequency connection 610. Moreover, the tunable capacitance circuit 600 is configured to receive a capacitance information 612, for example, a digital capacitance information. The digital capacitance information may, for example, comprise a plurality of bits, wherein a least significant bit (LSB) represents a smallest step size, and wherein a most significant bit (MSB) represents a maximum step size.

The tunable capacitance circuit includes a plurality of switchable capacitance branches 620a, 620b, 620c to 620m. The switchable capacitance branches 620a, 620b, 620c, 620m are coupled in parallel between the input connection 610 and a reference potential (for example, a ground potential). However, the switchable capacitance branches 620a, 620b, 620c, 620m may also be coupled in parallel between two electrical connections.

Each of the switchable capacitance branches 620a, 620b, 620c, 620m may, for example, includes a tunable capacitance circuit 200, as shown in FIG. 2 and as explained with reference to FIG. 2. In other words, the first switchable capacitance branches 620a may comprise a tunable capacitance circuit 622a, which may be substantially identical to the tunable capacitance circuit 200 according to FIG. 2. Similarly, the second switchable capacitance branch 620b may includes a tunable capacitance circuit 622b that may be substantially identical to the tunable capacitance circuit 200. Similarly, the switchable capacitance branches 620c and 620m may comprise tunable capacitance circuits 622c and 622m, which may also be substantially identical to the tunable capacitance circuit 200 according to FIG. 2.

For example, a first electrical connection of the tunable capacitance circuit 622 (which corresponds to the first electrical connection 210) may be coupled to the electrical connection 610. A second electrical connection of the tunable capacitance circuit 622 (which corresponds to the second electrical connection 212) may be coupled to the reference potential. Similarly, a first electrical connection of the tunable capacitance circuit 622b (which corresponds to the first electrical connection 210) may be coupled to the electrical connection 610, and a second electrical connection of the tunable capacitance circuit 622b (which corresponds to the second electrical connection 212) may be coupled to the reference potential. Also, a first electrical connection of the tunable capacitance circuit 622c (which corresponds to the first electrical connection 210) may be coupled to the electrical connection 610, and a second electrical connection of the tunable capacitance circuit 622c (which corresponds to the second electrical connection 212) may be coupled to the reference potential. Also, a first electrical connection of the tunable capacitance circuit 622m (which corresponds to the first electrical connection 210) may be coupled to the electrical connection 610, and a second electrical connection of the tunable capacitance circuit 622m (which corresponds to the second electrical connection 212) may be coupled to the reference potential.

In some examples, discharge resistors corresponding to the discharge resistor 254 of the tunable capacitance circuit 200 may be omitted in the tunable capacitance circuits 622a, 622b, 622c, 622m.

Moreover, a bias voltage connection of the tunable capacitance circuit 622a (which corresponds to the bias voltage connection or control voltage connection 214) may be coupled to a first bias voltage provider 624a (also sometimes designated a control voltage provider), a bias voltage connection of the tunable capacitance circuit 622b may be coupled to a second bias voltage provider 624b, a bias voltage connection of the tunable capacitance circuit 622c may be connected to a third bias voltage provider 624c and a bias voltage connection of the tunable capacitance circuit 620m may be coupled to a m-th bias voltage provider 624m. It should be noted that the bias voltage providers 624a, 624b, 624c, 624m may be part of the switchable capacitance branches, or may be separate from the switchable capacitance branches, depending on the actual implementation. However, in some embodiments, the bias voltage providers 624a, 624b, 624c, 624m may be implemented on the same substrate together with the tunable capacitance circuits 622a, 622b, 622c, 622m.

Moreover, it should be noted that the bias voltage providers 624a, 624b, 624c, 624m may, for example, be configured to provide two discrete bias voltages to the respective bias voltage connection of the respective tunable capacitance circuits (wherein the bias voltage connections of the tunable capacitance circuits 622a, 622b, 622c, 622m correspond to the bias voltage connection 214 of the tunable capacitance circuit 200).

Accordingly, each of the switchable capacitance branches 620a, 620b, 620c, 620m may be switchable between two capacitance values presented by the respective switchable capacitance branch between the electrical connection 610 and the reference potential, depending on whether the respective bias voltage provider provides a first discrete bias voltage or a second discrete bias voltage (which is different from the first discrete bias voltage).

Moreover, it should be noted that, in some embodiments, the different switchable capacitance branches may be switchable between different capacitance values. In other words, in some embodiments a high capacitance value (capacitance value in a high capacitance bias state) or a maximum capacitance value presented by the switchable capacitance branch 620m between the electrical connection 610 and the reference potential may be larger than a high capacitance value or maximum capacitance value presented between the electrical connection 610 and the reference potential by the switchable capacitance branch 620c. In turn, the high capacitance value or maximum capacitance value presented by the switchable capacitance branch 620c may be larger than a high capacitance value or maximum capacitance value presented by the switchable capacitance branch 620b between the electrical connection 610 and the reference potential. In turn, the high capacitance value or maximum capacitance value presented by the switchable capacitance branch 620 may be larger than a high capacitance value maximum capacitance value presented by the switchable capacitance branch 620a between the electrical connection 610 and the reference potential.

Thus, by using switchable capacitance branches with different high capacitance values or maximum capacitance values (and possibly also different low capacitance values or minimal capacitance values), a large total capacitance variation can be achieved between the electrical connection 610 and the reference potential, wherein each of the switchable capacitance branches can be switched between a first state, in which the respective switchable capacitance branch presents its high capacitance value or maximum capacitance value, and a second state in which the switchable capacitance branch presents its low capacitance value or minimum capacitance value.

Accordingly, different total capacitance values (which are formed by the parallel circuit of the individual capacitances presented by the switchable capacitance branches) are obtainable. For example, the different obtainable overall capacitance values are defined by all different combinations of maximum capacitance values and minimum capacitance values (or high and low capacitance values) of the individual switchable capacitance branches. It should be noted here that the "maximum capacitance value" designates a capacitance value presented by a switchable capacitance branch in a first state of the respective switchable capacitance branch, and that the "minimum" capacitance value represents a capacitance value presented by the switchable capacitance branch in a second state of the respective switchable capacitance branch. Typically, the "minimum capacitance value" (or low capacitance value) is close to an absolute minimum capacitance value obtainable by the respective switchable capacitance branch, and the "maximum capacitance value" (or high capacitance value) is close to an absolute maximum capacitance value obtainable by the switchable capacitance path, since the gate bias voltage may be chosen such that the varactor transistors of the switchable capacitance paths are switched between the first capacitance value very close to the absolute maximum capacitance value and a second capacitance value very close to the absolute minimum capacitance value. However, instead of the "maximum capacitance value" a first capacitance value associated with the respective switchable capacitance branch can be used, and instead of the minimum capacitance value, a second capacitance value of the respective switchable capacitance path can be used, if the switchable capacitance path is switched between two capacitance values which are substantially different from the maximum capacitance value and the minimum capacitance value.

Moreover, it should be noted that the bias voltage providers 624a, 624b, 624c, 624m may be controlled (for example, individually switched between two states) on the basis of the capacitance control information 612. For example, a logic circuit, a lookup table, or the like may be used to decide how to map the capacitance control information 612 input into the circuit arrangement 600 to the different combinations of the states of the bias voltage provider 624a, 624b, 624c, 624m. However, if the capacitance control information is binary coded information, each bit may control one of the bias voltage providers.

To conclude, since applying two binary states gives only two capacitors (or capacitance values), it is advantageous to combine a plurality of switchable capacitance branches. For example, one bit (e.g., of the capacitance control information) corresponds to one of the tunable capacitance circuits according to FIG. 2. Accordingly, a four bit digital tunable capacitance can be implemented as shown and as described with respect to FIG. 6.

In the following, some implementation aspects will be summarized. In an implementation, the tunable capacitance circuit 600 comprises a plurality of switchable capacitance branches 620a, 620b, 620c, 620m, which are coupled in parallel. The first switchable capacitance branch 620a comprises a first plurality of field-effect transistors (varactor transistors), which are coupled to act as a first series circuit of varactor transistors. The second switchable capacitance branch 620b comprises a second plurality of field-effect transistors (varactor transistors), which are coupled to act as a second series circuit of varactor transistors.

In an implementation, the tunable capacitance circuit comprises a control circuit (not shown in FIG. 6), which is configured to switch the first switchable capacitance branch 620a between two different capacitance values (for example, between a "maximum capacitance value" and a "minimum capacitance value", or between a high capacitance value and a low capacitance value) and to switch the second switchable capacitance branch 620b between two different capacitance values (for example, between a maximum (or high) capacitance value associated with the second switchable capacitance branch and a minimum (or low) capacitance value associated with the second switchable capacitance branch, or between two other discrete capacitance values).

In an implementation, the control circuit is configured to switchably apply a first gate source bias voltage or a second gate source bias voltage to the field-effect transistors of the first switchable capacitance branch 620a, wherein the first gate source bias voltage is chosen such that a gate source capacitance of the field-effect transistors of the first switchable capacitance branch differs from a maximum capacitance by no more than 10% for the first gate source bias voltage, and wherein the second gate source bias voltage is chosen such that a gate source capacitance of the field-effect transistors of the first switchable capacitance branch differs from a minimum capacitance by no more than 10% for the second gate source bias voltage. For example, the first gate source bias voltage and the second gate source bias voltage can be provided by the bias voltage provider 624a.

Similarly, the control circuit may be configured to switchably apply a first gate source bias voltage or a second gate source bias voltage to the field-effect transistors of the second switchable capacitance branch 620b, wherein the first gate source bias voltage is chosen such that a gate source capacitance of the field-effect transistors of the second switchable capacitance branch differs from a maximum capacitance by no more than 10% for the first gate source bias voltage, and wherein the second gate source bias voltage is chosen such that a gate source capacitance of the field-effect transistors of the second switchable capacitance branch differs from a minimum capacitance by no more than 10% for the second gate source bias voltage. The first gate source bias voltage associated with the first switchable capacitance branch may be equal or different from the first gate source bias voltage associated with the second switchable capacitance branch. Similarly, the second gate source bias voltage associated with the first switchable capacitance branch may be equal or different from the second gate source bias voltage associated with the second switchable capacitance branch.

In an implementation, the switchable capacitance branches may comprise different maximum (or high) capacitance values. For example, the different maximum capacitance values of different switchable capacitance branches may comprise capacitance ratios of approximately 2-to-1. However, different maximum (or high) capacitance values can also be chosen.

In an implementation, the control circuit may be configured to switch each of the switchable capacitance branches between a high capacitance state and a low capacitance state (for example, on the basis of the capacitance control information 612). For example, the control circuit may be (or comprise) a logic circuit, a lookup table or the like, which receives the capacitance control information 612 and provides switch signals to the bias voltage provider 624a, 624b, 624c, 624d.

In the following, some applications for the tunable capacitance circuit according to the present invention will be described. For example, the tunable capacitance circuit 100, the tunable capacitance circuit 200 and the tunable capacitance circuit 600 may be used as a capacitance tuner for antenna tuning. One example is a six bit capacitance tuner for mobile phones. For example, a maximum radio frequency voltage may be in the range of 60V, and a tuning range of the capacitance may, for example, be between 0.5 pF and 13.7 pF. To summarize, embodiments according to the invention can be used in antenna match applications and RF tuning applications.

In the following, a performance evaluation will be presented for an example implementation. As a comparison, the classic approach using a circuit with switched capacitors (wherein switching transistors are stacked 40 times) will be taken. FIG. 7a shows a graphical representation of a quality factor versus an effective capacitance for the classic approach. An abscissa 710 describes an effective capacitance, and an ordinate 720 describes a quality factor. Data points shown in the graphic representation of FIG. 7a represent different switching states and illustrate which quality factor can be obtained for which effective capacitance. As can be seen, comparatively small quality factors (below 25) are obtained over a large capacity range. In other words, it can be seen in FIG. 7a that using very high gate resistors (which may be included in the switch block model of the classic approach) it is possible to get quality factors (Q) of 30-35 for low capacitances, but only quality factors of approximately 15 for high capacitances (assuming metal-insulator-metal capacitors MIM with quality factor Q=80). Moreover, it should be noted that the simulation results of FIG. 7a have been made for a frequency of 900 MHz.

Moreover, a comparable circuit has been designed in accordance with the present invention, and simulation results are shown in FIG. 7b. In other words, FIG. 7b shows a graphic representation of a relationship between a capacitance value and a quality factor, which has been obtained using a simulation of an embodiment according to the present invention. An abscissa 760 describes an effective capacitance, and an ordinate 770 describes a quality factor. Data points in FIG. 7b represent different combinations of capacitances of six switchable capacitance branches.

It can be seen in FIG. 7b that the average quality factor is higher (with a first step design). Moreover, it should be noted that further improvements could foreseeably be found by increasing the gate resistors to improve the quality factors for low capacitance. Generally, the structure according to the present invention has a different nature when compared to the classical structure, wherein higher Q-factors are obtained for the higher capacitances.

FIGS. 9a-c illustrate transceiver systems that utilize embodiment varactor circuits. For example, transceiver circuit 900 shown in FIG. 9a includes transceiver circuit 902 and antenna switch module (ASM) 904 coupled to antenna 908 via tuner circuit 906. As shown, tuner circuit 906 includes series capacitor 910 constructed according to varactor embodiments described herein. By adjusting the capacitor of series capacitor 910, the inductance of antenna 908, as seen by ASM 904 may be adjusted.

FIG. 9b illustrates transmitter circuit 920 that includes transceiver 902 and ASM 904 coupled to antenna 908 via tuner circuit 922. Tuner circuit 922 includes a PI network having a first parallel LC tank that includes inductor 924 and tunable capacitor 926, a second parallel LC tank having inductor 934 and tunable capacitor 932, and a series LC tank having inductor 936 and tunable capacitor 930. In an embodiment tunable capacitors 926, 930 and 932 are implemented according to embodiment varactors disclosed herein. By tuning the value of capacitors 926, 930 and 932 the match between ASM 904 and antenna 908 may be adjusted.

FIG. 9c illustrates transmitter circuit 940 that includes transceiver 902 and ASM 904 coupled to antenna 908 via tuner circuit 942. Tuner circuit 922 includes a PI network having a first parallel LC tank that includes inductor 924 and tunable capacitor 926, a second parallel LC tank having inductor 934 and tunable capacitor 932, and a third parallel LC tank having inductor 936 and tunable capacitor 944. In an embodiment tunable capacitors 926, 932 and 944 are implemented according to embodiment varactors disclosed herein. By tuning the value of capacitors 926, 932 and 944 the match between ASM 904 and antenna 908 may be adjusted.

To summarize, embodiments according to the invention bring along better quality factors over a wide range of capacitance values, and also possess further potential for optimization.

To further summarize, embodiments according to the invention create a combination of a digital-tunable-capacitor concept and a varactor approach. The varactor is may designed using CMOS transistors or other types of field-effect transistors in some embodiments. In some embodiments that utilize a bulk switch process, the influence of the substrate diodes may be minimized or removed by stacking the varactors and switchably controlling the varactors. An embodiment according to the invention uses a single-die switch process, using a switch style control circuit. In other words, some embodiments according to the invention use a process which allows the implementation of transistors acting as varactor transistors and also the implementation of control circuits (for example, CMOS circuits) on a single chip. Some embodiments according to the invention are advantageous in that a much higher linearity and higher voltage ruggedness is provided compared to a classical varactor. In some embodiments according to the invention, high linearity may be achievable even using a low voltage process. Some embodiments according to the invention provide a good electrostatic discharge (ESD) robustness. In some embodiments according to the invention, no metal-insulator-metal capacitor (MIM cap) or gate is connected outside. Moreover, since in some embodiments according to the invention no metal-insulator-metal capacitor is required, the process can be made less complex when compared to other processes.

To further summarize, embodiments according to the invention provide a tunable capacitance, which may be used in a tunable radio frequency circuit as an adjustable impedance. Embodiments according to the invention consider the tunability of capacitors (or capacitances) to be focused on large signal suited capacitors (or capacitances). This type of tunable capacitor (or tunable capacitance) is usually used for antenna radio frequency matching, power amplifier output matching and all kinds of radio frequency filters that can face a strong radio frequency signal. Additionally, comparatively high quality factors can be obtained to maintain sharp filter curves and a low insertion loss. Moreover, the high linearity requirement, which is mandatory for some next generation mobile phone systems, can be met by some embodiments according to the invention.

A digitally tunable capacitance is provided according to an embodiment of the invention, which allows for the control of the capacitance.

Embodiments according to the invention also create a method for providing a tunable capacitance. This method comprises providing a first capacitance using a plurality of varactor transistors, which are coupled in series to act as a series circuit of varactor transistors, wherein the field-effect transistors are operated at a first bias condition. The method also comprises providing a second capacitance using the plurality of field-effect transistors, wherein the field-effect transistors are operated at a second bias condition.

However, the above-described method can be supplemented by any of the features and functionalities described herein, also with respect to the circuits and apparatuses according to the present invention.

Although some aspects have been described in the context of an apparatus, it is clear that these aspects also represent a description of the corresponding method, where a block or device corresponds to a method step or a feature of a method step. Analogously, aspects described in the context of a method step also represent a description of a corresponding block or item or feature of a corresponding apparatus.

The above described embodiments are merely illustrative for the principles of the present invention. It is understood that modifications and variations of the arrangements and the details described herein will be apparent to others skilled in the art. It is the intent, therefore, to be limited only by the scope of the impending patent claims and not by the specific details presented by way of description and explanation of the embodiments herein.

What is claimed is:

1. A tunable capacitance circuit, comprising:
a plurality of varactor transistor pairs coupled in series, wherein:
a first field-effect transistor pair of the plurality of varactor transistor pairs comprises a first field-effect transistor and a second field-effect transistor;
a second field-effect transistor pair of the plurality of varactor transistor pairs comprises a third field-effect transistor and a fourth field-effect transistor;
the first field-effect transistor, the second field-effect transistor, the third field-effect transistor, and the fourth field-effect transistor are coupled in series;
a source terminal of the first field-effect transistor is coupled with a drain terminal of the first field-effect transistor;
a gate terminal of the first field-effect transistor is coupled with a gate terminal of the second field-effect transistor;
a source terminal of the second field-effect transistor is coupled with a drain terminal of the second field-effect transistor, a source terminal of the third field-effect transistor, and a drain terminal of the third field-effect transistor;
the source terminal of the second field-effect transistor, the drain terminal of the second field-effect transistor, the source terminal of the third field-effect transistor, and the drain terminal of the third field-effect transistor are coupled to a reference potential via an impedance element;
a gate terminal of the third field-effect transistor is coupled with a gate terminal of the fourth field-effect transistor;
a source terminal of the fourth field-effect transistor is coupled with a drain terminal of the fourth field-effect transistor and not directly coupled to the source terminal of the first field-effect transistor or the drain terminal of the first field-effect transistor;
the gate terminals of the first field-effect transistor pair are coupled to a control voltage provider via a first gate impedance element; and
the gate terminals of the second field-effect transistor pair are coupled to the control voltage provider via a second gate impedance element.

2. The tunable capacitance circuit according to claim 1, wherein:
the plurality of varactor transistor pairs coupled in series is a first plurality of varactor transistor pairs coupled in series;
the tunable capacitance circuit further comprises a second plurality of varactor transistor pairs coupled in series;
the tunable capacitance circuit comprises a plurality of switchable capacitance branches, which are coupled in parallel;
a first switchable capacitance branch of the plurality of switchable capacitance branches comprises the first plurality of varactor transistors which are coupled in series to act as a first series circuit of varactor transistors; and
a second switchable capacitance branch of the plurality of switchable capacitance branches comprises the second plurality of varactor transistors which are coupled in series to act as a second series circuit of varactor transistors.

3. The tunable capacitance circuit according to claim 2, wherein the plurality of switchable capacitance branches comprise different maximum capacitance values.

4. The tunable capacitance circuit according to claim 2, wherein the tunable capacitance circuit comprises a control circuit configured to switch the first switchable capacitance branch between two different capacitance values, and to switch the second switchable capacitance branch between two different capacitance values.

5. The tunable capacitance circuit according to claim 4, wherein the control circuit is configured to switchably apply a first gate-source bias voltage or a second gate-source bias voltage to the varactor transistors of the first switchable capacitance branch, wherein the first gate-source bias voltage is chosen such that a gate-source capacitance of the varactor transistors of the first switchable capacitance branch differs from a maximum capacitance by no more than 10% for the first gate-source bias voltage, and
wherein the second gate-source bias voltage is chosen such that a gate-source capacitance of the varactor transistors of the first switchable capacitance branch differs from a minimum capacitance by no more than 10% for the second gate-source bias voltage.

6. The tunable capacitance circuit according to claim 4, wherein the control circuit is configured to switchably apply a first gate-source bias voltage or a second gate-source bias voltage to the varactor transistors of the second switchable capacitance branch, wherein the first gate-source bias voltage is chosen such that a gate-source capacitance of the varactor transistors of the second switchable capacitance branch differs from a maximum capacitance by no more than 10% for the first gate-source bias voltage, and wherein the second gate-source bias voltage is chosen such that a gate-source capacitance of the varactor transistors of the second switchable capacitance branch differs from a minimum capacitance by no more than 10% for the second gate-source bias voltage.

7. The tunable capacitance circuit according to claim 4, wherein the control circuit is configured to switch each of the plurality of switchable capacitance branches between a respective high-capacitance state and a respective low-capacitance state.

8. The tunable capacitance circuit according to claim 1, wherein
the varactor transistors of the plurality of varactor transistor pairs are formed in or on a substrate; and
one or more body regions are biased such that drain-body diodes and source-body diodes of the varactor transistors of the plurality of varactor transistor pairs are reverse biased.

9. The tunable capacitance circuit according to claim 8, wherein the substrate is a semiconductor-on-isolator substrate or a silicon-on-isolator substrate.

10. The tunable capacitance circuit according to claim 1, wherein:
the varactor transistors of the plurality of varactor transistor pairs are formed in or on a substrate; and
the substrate is biased such that drain-bulk diodes and source-bulk diodes of the varactor transistors of the plurality of varactor transistor pairs are reverse-biased.

11. The tunable capacitance circuit according to claim 10, wherein the substrate is a silicon substrate having a resistivity of at least 500 Ohm cm.

12. The tunable capacitance circuit according to claim 1, wherein:
a capacitance of the first field-effect transistor depends on a gate-source bias voltage applied to the first field-effect transistor; and
a capacitance of the second field-effect transistor depends on a gate-source bias voltage applied to the second field-effect transistor.

13. The tunable capacitance circuit according to claim 1, wherein the control voltage provider is configured to switch a control voltage, which is applied to control terminals of the varactor transistors of the plurality of varactor transistor pairs, between two discrete values.

14. The tunable capacitance circuit according to claim 13, wherein the control voltage provider is configured to provide the control voltage such that the varactor transistors of the plurality of varactor transistor pairs are operated in an inversion mode for a first discrete value of the control voltage, and such that the varactor transistors of the plurality of varactor transistor pairs are operated in an accumulation mode for a second discrete value of the control voltage.

15. The tunable capacitance circuit according to claim 1, wherein a channel length of the varactor transistors of the plurality of varactor transistor pairs is longer than 5 μm.

16. The tunable capacitance circuit according to claim 15, wherein:
a ratio between a gate-source capacitance of the varactor transistors of the plurality of varactor transistor pairs in a first bias state to a gate-source capacitance in a second bias state is at least three;
the gate-source capacitance in the first bias state takes a maximum value; and
the gate-source capacitance in the second bias state takes a minimum value.

17. The tunable capacitance circuit according to claim 15, wherein respective gate electrodes of the varactor transistors of the plurality of varactor transistor pairs each comprise a plurality of contacts to a metallization layer, wherein the respective plurality of contacts are distributed along the corresponding gate electrode.

18. An antenna tuner comprising a tunable capacitance circuit according to claim 1.

19. A circuit comprising:
a plurality of tunable capacitance branches coupled to a respective plurality of branch tuning nodes, wherein each tunable capacitance branch comprises a plurality of varactor elements coupled in series, each varactor element comprising a transistor pair comprising a first transistor and a second transistor coupled in series, the first transistor having a control node coupled to a first terminal of the varactor element, a tuning impedance element coupled between the first terminal of the varactor element and the respective branch tuning node, and a plurality of output nodes coupled to a second terminal of the varactor element, wherein the second terminal of a first varactor element of the plurality of varactor elements is coupled to the second terminal of a second varactor element of the plurality of varactor elements, wherein the second terminal of the first varactor element of the plurality of varactor elements and the second terminal of the second varactor element of the plurality of varactor elements are coupled through an impedance element to a reference potential.

20. The circuit of claim 19, further comprising a plurality of bias voltage providers having outputs coupled to the respective plurality of branch tuning nodes.

21. The circuit of claim 20, wherein each of the plurality of bias voltage providers are configured to provide discrete bias voltages.

22. The circuit of claim 21, wherein each of the plurality of bias voltage providers are configured to provide two discrete bias voltages.

23. The circuit of claim 20, wherein each of the plurality of bias voltage providers are configured to switchably apply a first gate-source bias voltage or a second gate-source bias voltage to the transistors of each tunable capacitance branch, wherein the first gate-source bias voltage is chosen such that a gate-source capacitance of the transistors of each respective tunable capacitance branch differs from a maximum capacitance by no more than 10% for the first gate-source bias voltage, and
wherein the second gate-source bias voltage is chosen such that a gate-source capacitance of the transistors of each respective tunable capacitance branch differs from a minimum capacitance by no more than 10% for the second gate-source bias voltage.

24. The circuit of claim 19, wherein the plurality of tunable capacitance branches are coupled in parallel.

25. A method for providing a tunable capacitance, the method comprising:
providing a first capacitance using a plurality of switchable capacitance branches coupled in parallel, wherein each switchable capacitance branch comprises:
a plurality of varactor transistor pairs which are coupled in series with each other via a coupling between first respective series terminals of respective varactor transistor pairs and second respective series terminals of adjacent respective varactor transistor pairs, wherein the coupling is coupled to a reference node, and wherein each varactor transistor pair of the plurality of varactor transistor pairs comprises:
a first varactor transistor coupled in series to a second varactor transistor, wherein a source terminal and a drain terminal of the first varactor transistor are coupled to each other and to the first series terminal of the varactor transistor pair, wherein a source terminal and a drain terminal of the second varactor transistor are coupled to each other and to the second series terminal of the varactor transistor pair, and wherein a gate terminal of the first varactor transistor is coupled to a gate terminal of the second varactor transistor, wherein the varactor transistor pairs of each switchable capacitance branch are operated at a first respective bias condition; and providing a second capacitance using the plurality of switchable capacitance branches, wherein the varactor transistor pairs of each switchable capacitance branch are operated at a second respective bias condition.

26. The method of claim 25, wherein the first respective bias condition comprises a first gate-source bias voltage that is chosen such that a gate-source capacitance of the varactor transistor pairs of a first switchable capacitance branch differs from a maximum capacitance by no more than 10% for the first gate-source bias voltage.

27. A tunable capacitance circuit comprising:
a plurality of varactor transistor pair elements coupled in series, wherein each varactor transistor pair element in the plurality of varactor transistor pair elements comprises:
  a first varactor transistor comprising a first gate terminal coupled to a tuning terminal of the varactor transistor pair element and comprising a first drain terminal coupled to a first source terminal and a first series terminal of the varactor transistor pair element, and
  a second varactor transistor coupled in series to the first varactor transistor and comprising a second gate terminal coupled to the first gate terminal of the first varactor transistor and coupled to the tuning terminal of the varactor transistor pair element and comprising a second drain terminal coupled to a second source terminal and a second series terminal of the varactor transistor pair element;
wherein the second series terminal of a first varactor transistor pair element of the plurality of varactor transistor pair elements is connected to the first series terminal of a second varactor transistor pair element of the plurality of varactor transistor pair elements, the second series terminal of the first varactor transistor pair element and the first series terminal of the second varactor transistor pair element are coupled to a reference potential via an impedance element, and at least one bias resistor is respectively coupled between a tuning node and each respective tuning terminal of each of the plurality of varactor transistor pair elements.

28. The tunable capacitance circuit of claim 27, further comprising a control circuit configured to switchably apply a first gate-source bias voltage or a second gate-source bias voltage to the varactor transistors of the plurality of varactor transistor pair elements, wherein the first gate-source bias voltage is chosen such that a gate-source capacitance of the varactor transistors differs from a maximum capacitance by no more than 10% for the first gate-source bias voltage, and
wherein the second gate-source bias voltage is chosen such that a gate-source capacitance of the varactor transistors differs from a minimum capacitance by no more than 10% for the second gate-source bias voltage.

29. The tunable capacitance circuit of claim 27, wherein: the first varactor transistor comprises a first metal oxide semiconductor (MOS) transistor.

30. The tunable capacitance circuit of claim 27, wherein the reference potential comprises a ground node.

31. A tunable capacitance circuit, comprising:
a plurality of varactor transistor pairs coupled in series, wherein
  the varactor transistors of each of the plurality of varactor transistor pairs are coupled in series within the varactor transistor pair and are formed in or on a substrate, and wherein the substrate is biased such that drain-bulk diodes and source-bulk diodes of the varactor transistors are reverse-biased,
  a source terminal of a first field-effect transistor of a first varactor transistor pair of the plurality of varactor transistor pairs is coupled with a drain terminal of the first field-effect transistor,
  a source terminal of a second field-effect transistor of the first varactor transistor pair of the plurality of varactor transistor pairs is coupled with a drain terminal of the second field-effect transistor, and
  a gate terminal of the first field-effect transistor is coupled with a gate terminal of the second field-effect transistor, such that the first field-effect transistor acts as a first varactor transistor, and such that the second field-effect transistor acts as a second varactor transistor,
  a capacitance of the first field-effect transistor depends on a gate-source bias voltage applied to the first field-effect transistor, and
  a capacitance of the second field-effect transistor depends on a gate-source bias voltage applied to the second field-effect transistor;
wherein the source terminal and the drain terminal of the second field-effect transistor are coupled to a reference potential via an impedance element, wherein the source terminal and the drain terminal of a third field effect transistor of a second varactor transistor pair of the plurality of varactor transistor pairs are coupled to the reference potential via the impedance element,
the gate terminal of the first field-effect transistor and the gate terminal of the second field-effect transistor are coupled to a control voltage provider via a gate impedance element, and
the control voltage provider is configured to switch a control voltage, which is applied to the gate terminals of the field-effect transistors, between two discrete values.

32. The tunable capacitance circuit of claim 31, wherein the first discrete value of control voltage is chosen such that a gate-source capacitance of the field-effect transistors differs from a maximum capacitance by no more than 10% for the first discrete value of control voltage, and
wherein the second discrete value of control voltage is chosen such that a gate-source capacitance of the field-effect transistors differs from a minimum capacitance by no more than 10% for the second discrete value of control voltage.

* * * * *